(12) United States Patent
Hwang et al.

(10) Patent No.: US 8,881,381 B2
(45) Date of Patent: Nov. 11, 2014

(54) METHOD OF MANUFACTURING PRINTED CIRCUIT BOARD

(75) Inventors: Mi Sun Hwang, Gyunggi-do (KR); Myung Sam Kang, Gyunggi-do (KR); Ok Tae Kim, Gyunggi-do (KR); Seon Ha Kang, Gyunggi-do (KR); Gil Yong Shin, Jeollabuk-do (KR); Kil Yong Yun, Gyunggi-do (KR); Min Jung Cho, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 1377 days.

(21) Appl. No.: 12/631,594

(22) Filed: Dec. 4, 2009

(65) Prior Publication Data

US 2011/0061231 A1 Mar. 17, 2011

(30) Foreign Application Priority Data

Sep. 14, 2009 (KR) .................. 10-2009-0086445

(51) Int. Cl.
*H05K 3/36* (2006.01)
*H05K 3/10* (2006.01)
*H05K 3/20* (2006.01)
*H05K 3/46* (2006.01)
*H05K 3/00* (2006.01)
*H05K 3/42* (2006.01)

(52) U.S. Cl.
CPC ............ *H05K 3/4685* (2013.01); *H05K 3/421* (2013.01); *H05K 3/205* (2013.01); *H05K 2203/1536* (2013.01); *H05K 3/0097* (2013.01); H05K 2201/0376 (2013.01); H05K 2203/0152 (2013.01)

USPC ................ 29/830; 29/831; 29/846; 29/847; 29/852; 438/118; 438/107; 438/464

(58) Field of Classification Search
USPC ................ 29/830, 840, 847, 852, 831, 846; 438/118, 107, 464
See application file for complete search history.

(56) References Cited

U.S. PATENT DOCUMENTS

| 7,232,755 B1* | 6/2007 | McLellan et al. ............. 438/674 |
| 7,538,022 B2* | 5/2009 | Kurita et al. .................. 438/614 |
| 7,971,352 B2* | 7/2011 | Okabe et al. .................... 29/843 |
| 2007/0141757 A1* | 6/2007 | Nomura ....................... 438/125 |
| 2009/0169912 A1* | 7/2009 | Hoyt et al. .................... 428/586 |
| 2010/0102838 A1* | 4/2010 | Kitazume et al. ............. 324/754 |

* cited by examiner

*Primary Examiner* — Peter DungBa Vo
*Assistant Examiner* — Kaying Kue
(74) *Attorney, Agent, or Firm* — Bracewell & Giuliani LLP; Brad Y. Chin

(57) ABSTRACT

Disclosed herein is a method of manufacturing a printed circuit board, comprising: preparing a first carrier including a first pattern formed on one side thereof; preparing a second carrier including a first solder resist layer and a second pattern sequentially formed on one side thereof; pressing the first carrier and the second carrier such that the first pattern is embedded in one side of an insulation layer and the second pattern is embedded in the other side of the insulation layer and then removing the first carrier and the second carrier to fabricate two substrates; attaching the two substrates to each other using an adhesion layer such that the first solder resist layers face each other; and forming a via for connecting the first pattern with the second pattern in the insulation layer, forming a second solder resist on the insulation layer provided with the first pattern, and then removing the adhesion layer.

6 Claims, 11 Drawing Sheets

ND OF MANUFACTURING PRINTED
METHOD OF MANUFACTURING PRINTED CIRCUIT BOARD

CROSS REFERENCE TO RELATED APPLICATION

This application claims the benefit of Korean Patent Application No. 10-2009-0086445, filed Sep. 14, 2009, entitled "A fabricating Method Of A Printed Circuit Board", which is hereby incorporated by reference in its entirety into this application.

BACKGROUND OF THE INVENTION

1. Technical Field

The present invention relates to a method of manufacturing a printed circuit board.

2. Description of the Related Art

Generally, printed circuit boards (PCBs) are manufactured by patterning one or both sides of a substrate, composed of various thermosetting resins, using copper foil, and disposing and fixing ICs or electronic parts on the substrate to form an electric circuit.

Recently, with the advancement of the electronics industry, electronic parts are increasingly required to be highly functionalized, light, thin, short and small. Printed circuit boards loaded with such electronic parts are also required to be highly densified and thin.

In order to meet the above requirement, a circuit transfer process is being proposed. FIGS. 1 to 7 are sectional views showing a conventional method of manufacturing a printed circuit board using the circuit transfer process. Hereinafter, the conventional method of manufacturing a printed circuit board will be described with reference to FIGS. 1 to 7.

First, as shown in FIG. 1, a first copper foil layer 14a is adhered on one side of a tape 12, and then a first metal barrier layer 16a is formed on the first copper foil layer 14a. Further, a second copper foil layer 14b is adhered on the other side of the tape 12, and then a second metal barrier layer 16b is formed on the second copper foil layer 14b to prepare a carrier 10.

Subsequently, as shown in FIG. 2, a first pattern 18a is formed on the first metal barrier layer 16a, and a second pattern 18b is formed on the second metal barrier layer 16b. Hereinafter, for the convenience of explanation, the assembly of the first copper foil layer 14a, the first metal barrier layer 16a and the first pattern 18a is designated as a first carrier part, and the assembly of the second copper foil layer 14b, second metal barrier layer 16b and second pattern 18b is designated as a second carrier part.

Subsequently, as shown in FIG. 3, the first carrier part and the second carrier part are separated from the tape 12.

Subsequently, as shown in FIG. 4, the first and second carrier parts are placed on both sides of an insulation layer 20 and then pressed to embed the first pattern 18a and the second pattern 18b into the insulation layer 20.

Subsequently, as shown in FIG. 5, the first copper foil layer 14a and the second copper foil layer 14b are removed, and then a via hole 22 for interlayer connection is formed in the insulation layer 20.

Subsequently, as shown in FIG. 6, the via hole 22 is plated to form a plating layer, and then the plating layer formed on the insulation layer 20 and the first and second barrier layers 16a and 16b are removed.

Finally, as shown in FIG. 7, first and second solder resist layers 26a and 26b are formed on both sides of the insulation layer 20, and then first and second openings 28a and 28b for exposing pad regions formed in the first and second solder resist layers 26a and 26b to manufacture a two-layered printed circuit board.

However, when a thin printed circuit board is manufactured using the above conventional method, there is a problem in that the thin printed circuit board is damaged (broken or rolled) and thus processes are delayed. For example, a two-layered thin printed circuit board having a thickness of about 80 μm or less is damaged during a process of forming a via hole 22 (refer to FIG. 5) or a process of forming solder resist layers 26a and 26b. As the thickness of a printed circuit board is decreased, it is difficult to entirely apply the above conventional method.

SUMMARY OF THE INVENTION

Accordingly, the present invention has been made to solve the above-mentioned problems, and the present invention seeks to provide a method of manufacturing a thin printed circuit board, which can prevent the thin printed circuit board from being damaged during its manufacturing process.

A first aspect of the present invention provides a method of manufacturing a printed circuit board, comprising: preparing a first carrier including a first pattern formed on one side thereof; preparing a second carrier including a first solder resist layer and a second pattern sequentially formed on one side thereof; pressing the first carrier and the second carrier such that the first pattern is embedded in one side of an insulation layer and the second pattern is embedded in the other side of the insulation layer and then removing the first carrier and the second carrier to fabricate two base substrates; attaching the two base substrates to each other using an adhesion layer such that the first solder resist layers face each other; and forming a via for connecting the first pattern with the second pattern in the insulation layer, forming a second solder resist on the insulation layer provided with the first pattern, and then removing the adhesion layer.

In the method, the preparing of the first carrier may include: sequentially forming a copper foil layer and a metal barrier layer on one side or both sides of a tape; forming a first pattern on the metal barrier layer; and removing the tape to prepare a first carrier including the copper foil layer and the metal barrier layer whose one side is provided with the first pattern.

Further, the preparing of the second carrier may include: sequentially forming a copper foil layer and a first solder resist layer on one or both sides of a tape; forming a seed layer on the first solder resist layer; forming a plating layer on the seed layer and then patterning the seed layer and the plating layer to form a second pattern; and removing the to tape to prepare a second carrier including the first solder resist layer and the plating layer whose one side is provided with the second pattern.

Further, in the forming of the via, before removing the adhesion layer, an opening may be formed in the second solder resist layer, and then a protective layer may be formed on the first pattern exposed through the opening.

Further, the method of manufacturing a printed circuit board may further comprise: after the forming of the via, forming an opening in the first solder resist layer; and forming a protective layer on the second pattern exposed through the opening.

Further, the adhesion layer may be made of a thermal adhesive exhibiting nonadhesiveness during heat treatment.

A second aspect of the present invention provides a method of manufacturing a printed circuit board, comprising: preparing a carrier including a first pattern formed on one side thereof; sequentially forming a first solder resist layer and a second pattern on both sides of an adhesion layer to prepare an intermediate substrate; disposing the carriers on both sides of the intermediate substrate such that an insulation layer faces the first pattern and then thermally pressing the carriers; removing the carriers, forming a via for connecting the first pattern with the second pattern in the insulation layer, and then forming a second solder resist layer on the insulation layer in which the second pattern is formed; and removing the adhesion layer.

In the method, the preparing of the carrier may include: sequentially forming a copper foil layer and a metal barrier layer on one side or both sides of a tape; forming a first pattern on the metal barrier layer; and removing the tape to prepare a first carrier including the copper foil layer and the metal barrier layer whose one side is provided with the first pattern.

Further, the preparing of the intermediate substrate may include: forming a first solder resist layer on an adhesion layer; forming a seed layer on the first solder resist layer; and forming a plating layer on the seed layer and then patterning the seed layer and the plating layer to form a second pattern.

Further, the method of manufacturing a printed circuit board may further comprise: after the removing of the carriers, forming an opening in the second solder resist layer; and forming a protective layer on the first pattern exposed through the opening.

Further, the method of manufacturing a printed circuit board may further comprise: after the removing of the adhesion layer, forming an opening in the first solder resist layer; and forming a protective layer on the second pattern exposed through the opening.

Further, the adhesion layer may be made of a thermal adhesive exhibiting nonadhesiveness during heat treatment.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
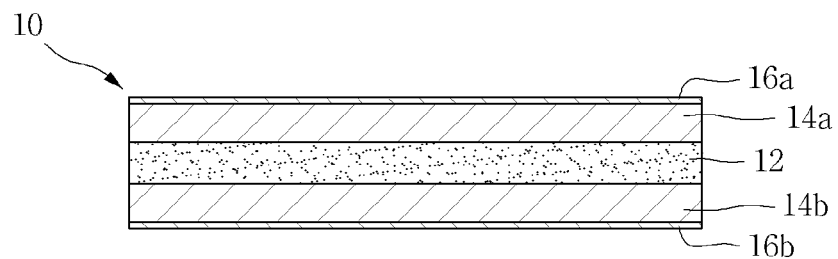
FIGS. 1 to 7 are sectional views showing a conventional method of manufacturing a printed circuit board using a circuit transfer process.
Figure 2:
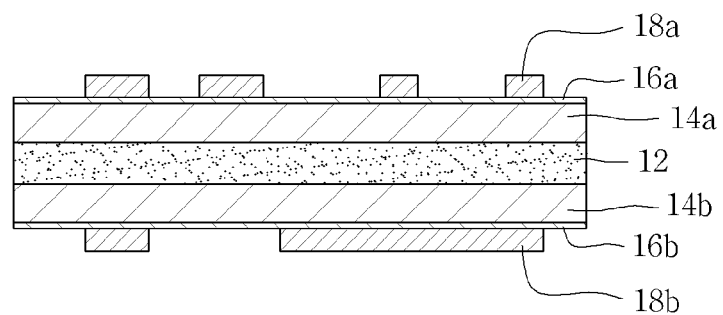
Figure 3:
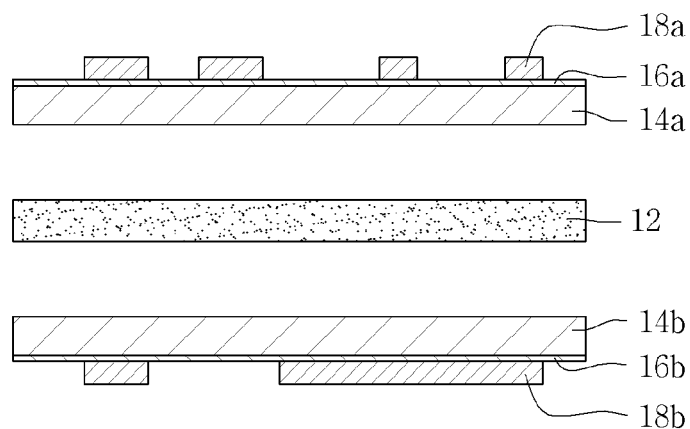
Figure 4:
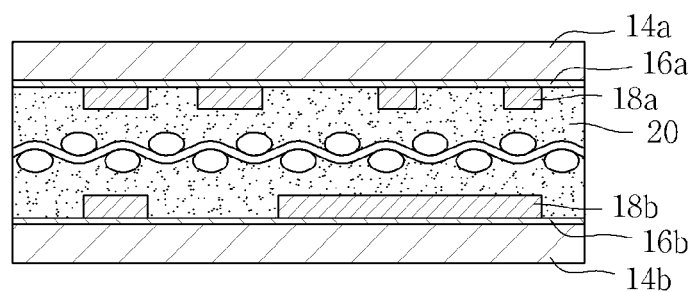
Figure 5:
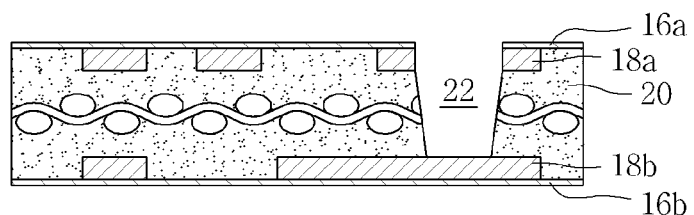
Figure 6:
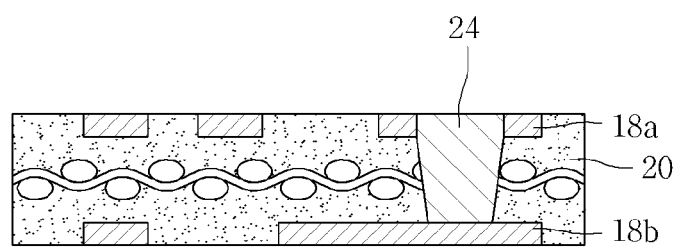
Figure 7:
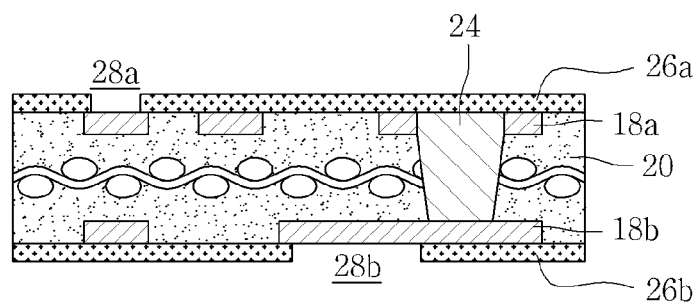

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIGS. 8 to 21 are sectional views showing a method of manufacturing a printed circuit board according to a first embodiment of the present invention. Hereinafter, the method of manufacturing a printed circuit board according to this embodiment of the present invention will be described with reference to FIGS. 8 to 21.

Figure 8:
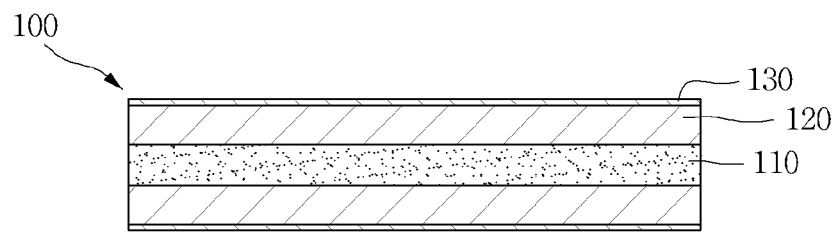
FIGS. 8 to 21 are sectional views showing a method of manufacturing a printed circuit board according to a first embodiment of the present invention.

First, as shown in FIG. 8, copper foil layers 120 are adhered on both sides of a tape 110, and then metal barrier layers 130 are formed on the copper foil layers 120 to prepare a carrier 100. Here, the tape 110 is a material on which the copper foil layers 120 can be adhered because it has adhesivity.

Figure 9:
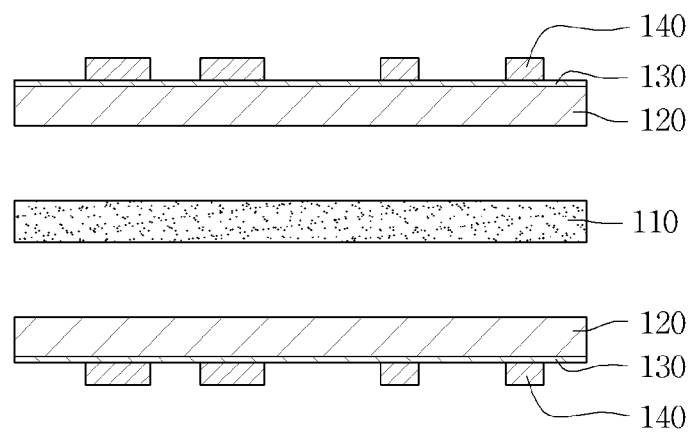

Subsequently, as shown in FIG. 9, first patterns 140 are formed on the metal barrier layers 130, and then each assembly of the copper foil layer 120, metal barrier layer 130 and first pattern 140 is separated from the tape 110. Here, each assembly of the copper foil layer 120, metal barrier layer 130 and first pattern 140 is designated as a first carrier.

In this case, the first pattern 140 is formed by applying a photoresist, such as a dry film, on the metal bather layer 130, forming openings for exposing pattern forming regions in the photoresist, plating the openings and then removing the photoresist.

Figure 10:
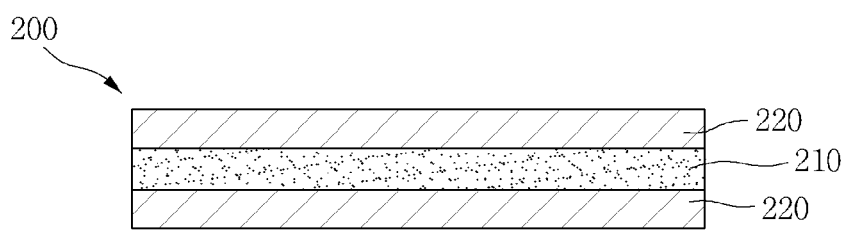

Subsequently, as shown in FIG. 10, copper foil layers 220 are adhered on both sides of a tape 210 to prepare a carrier 200.

Figure 11:
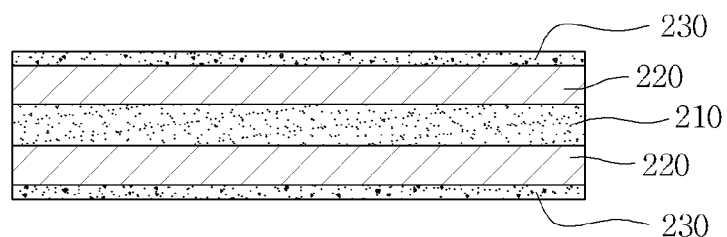

Subsequently, as shown in FIG. 11, first solder resist layers 230 are formed on the copper foil layers 220.

Figure 12:
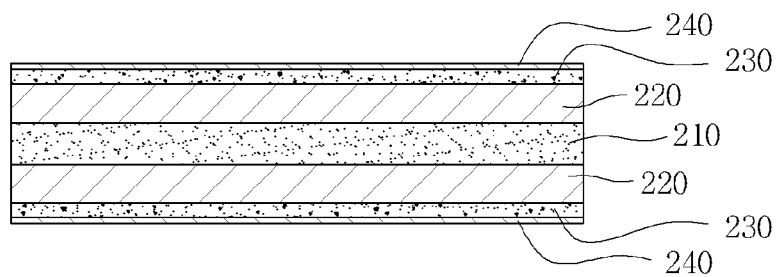

Subsequently, as shown in FIG. 12, seed layers 240 are formed on the first solder resist layers 230.

In this case, the seed layers 240 are formed in order to impart conductivity to the first solder resist layers 230 using a surface treatment method of depositing metals on the surface of a nonconductive material through a chemical reduction reaction to impart conductivity thereto because electrolytic plating cannot be directly performed on the surface of the first solder resist layers 230. For example, the seed layers are formed through an electroless plating process using a general catalyst deposition method including cleaning, soft etching, pre-catalysis, catalysis, activation, electroless copper plating and antioxidation procedures.

Figure 13:
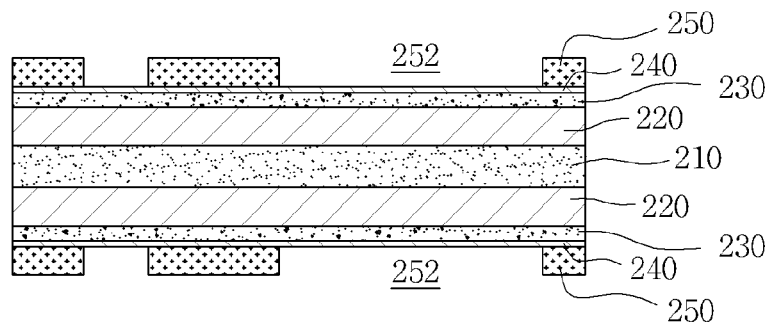

Subsequently, as shown in FIG. 13, photoresists 250 are applied on the seed layers 240, and then the photoresists 250 corresponding to pattern forming regions are removed to from openings 252. Here, the pattern forming regions are regions in which second patterns are formed.

Specifically, this step is performed by exposing a dry film or a photoresist 250, such as a positive liquid photoresist (P-LPR), using a predetermined mask pattern (not shown) and then removing the partially-exposed photoresist 250 using a developer.

Figure 14:
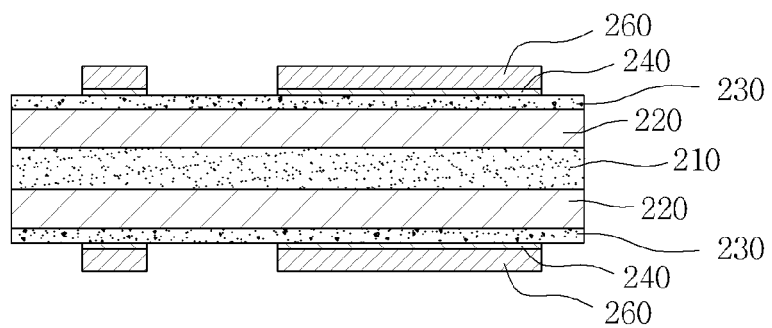

Subsequently, as shown in FIG. 14, electrolytic plating is performed in the openings 252 to form plating layers, and then the remaining photoresists 250 are removed using a stripper, such as sodium hydroxide (NaOH), potassium hydroxide (KOH) or the like. Here, each assembly of the seed layer 240 and the plating layer 260 is designated as a second pattern.

Figure 15:
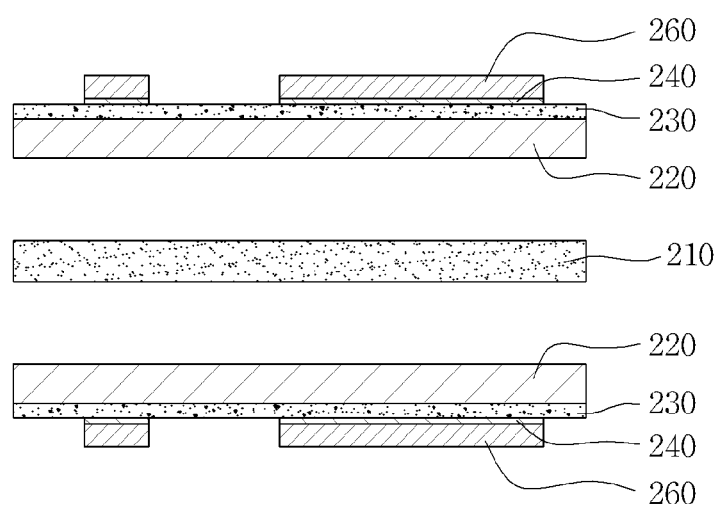

Subsequently, as shown in FIG. 15, second carriers formed on both sides of the tape 210 are separated from the tape 210. Here, the copper foil layer 220 sequentially provided thereon with the first solder resist layer 230 and the second pattern is designated as the second carrier.

Figure 16:
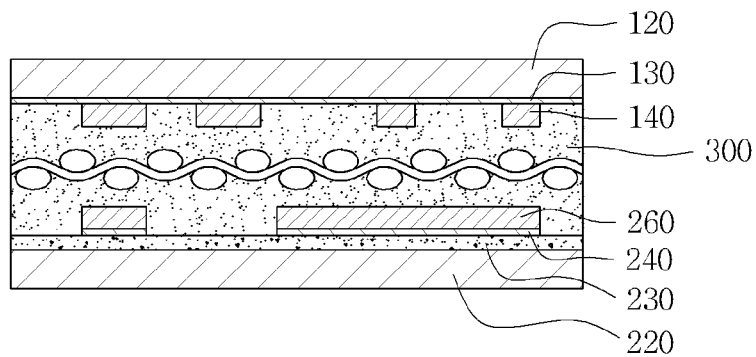

Subsequently, as shown in FIG. 16, the first carrier and the second carrier are placed on both sides of an insulation layer 300 and then pressed to embed the first pattern 140 and the second pattern 240 and 260 into the insulation layer 300.

Figure 17:
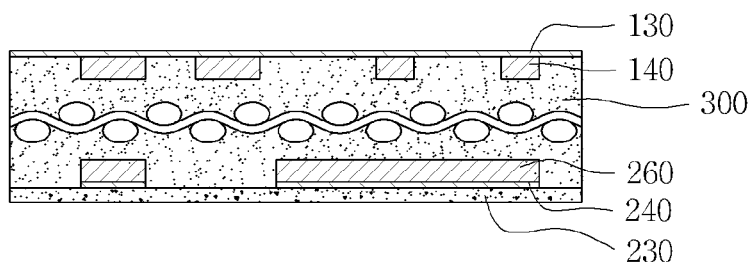

Subsequently, as shown in FIG. 17, the copper foil layers 120 and 220 are removed through etching to fabricate a base substrate.

Figure 18:
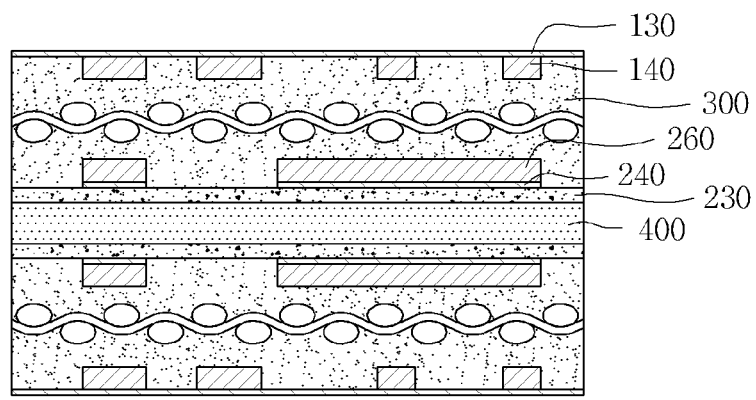

Subsequently, as shown in FIG. 18, two base substrates are attached to each other using an adhesion layer 400 such that the first solder resist layers 230 face each other.

In this step, since the two base substrates are attached to form a dual structure, the function of supporting is increased, and thus the damage of a printed circuit board can be prevented despite additional processes being performed. Further, since the two base substrates are attached to each other through the adhesion layer 400 in a state in which the first solder resist layer 230 is previously formed on the insulation layer 300 in which the second pattern 240 and 260 is formed, an additional solder resist layer is not required to be formed, thus minimizing the damage of a thin printed circuit board.

Here, the adhesion layer 400 may be formed of a thermal adhesive exhibiting nonadhesiveness at the time of heat treatment. Many kinds of thermal adhesives well known in the art can be used to form the adhesion layer 400 without limitation as long as they maintain adhesiveness at room temperature and lose adhesiveness at the time of heat treatment so that the adhesion layer is easy to separate from the adherend. For example, a thermal adhesive composed of an acrylic resin and a foaming agent exhibiting nonadhesiveness at the time of heat treatment at a temperature of about 100~150° C. can be used, but the present invention is not limited thereto.

Figure 19:
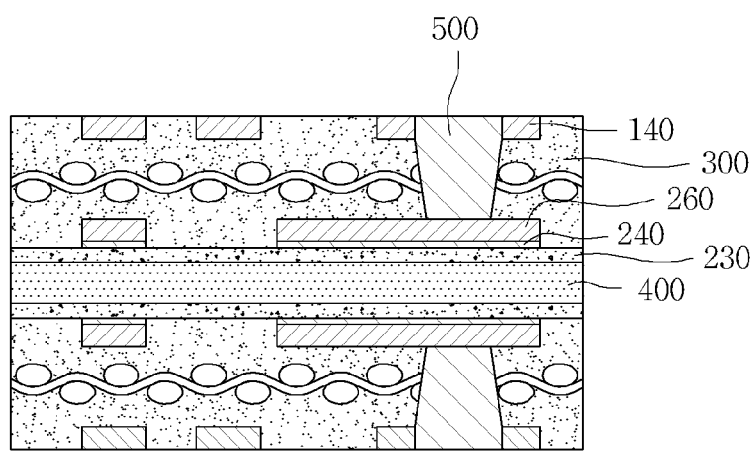

Subsequently, as shown in FIG. 19, a via 500 for interlayer connection is formed in the insulation layer 300, and the metal barrier layer 130 is removed.

In this step, a via hole is formed in the insulation layer 300 through drilling work such as computer numerical controlled (CNC) drilling, $CO_2$ drilling or Yag laser drilling, and then deburring and desmearing works are performed in order to remove the burr and smear of copper foil produced by the drilling work. Thereafter, plating is performed in the via hole, the plating layer formed on the insulation layer 300 is removed, and then the metal barrier layer 130 is removed.

Figure 20:
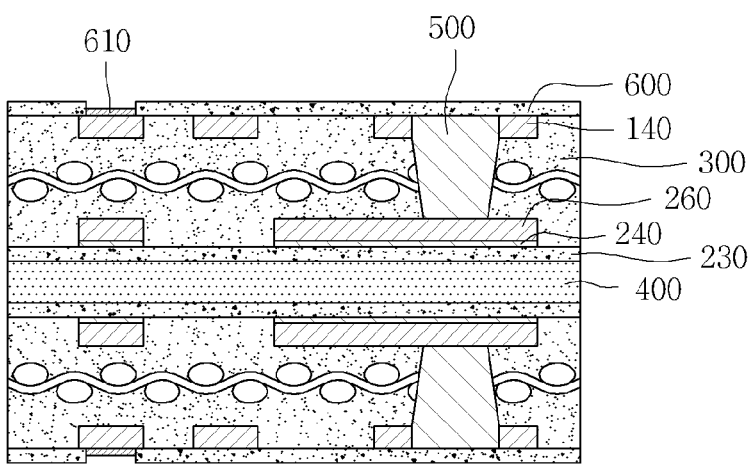

Subsequently, as shown in FIG. 20, a second solder resist layer 600 is formed on the insulation layer 300, openings for exposing the pad regions of the first pattern 140 are formed in the second solder resist layer 600, and then a protective layer 610 for protecting the exposed first pattern 140 from the external environment is formed.

Figure 21:
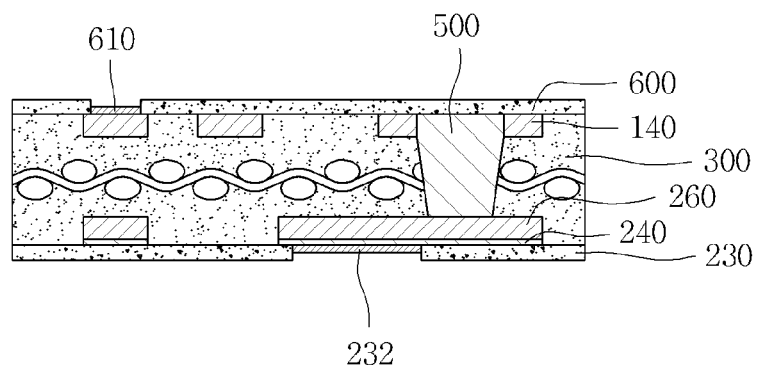

Finally, as shown in FIG. 21, the adhesion layer 400 is removed to manufacture a two-layered printed circuit board. In this case, when a thermal adhesive is used, the two-layered printed circuit board is divided into two single-layered printed circuit boards by applying heat to the thermal adhesive. Thereafter, openings for exposing the pad regions of the second pattern 240 and 260 are formed in the first solder resist layer 230, and then a protective layer 232 for protecting the exposed second pattern 240 and 260 from the external environment is formed.

FIGS. 22 to 25 are sectional views showing a method of manufacturing a printed to circuit board according to a second embodiment of the present invention. In the description of the method of manufacturing a printed circuit board according to the second embodiment of the present invention, the same reference numerals are used to designate the components the same as or similar to those of the above first embodiment, and redundant descriptions thereof will be omitted. Hereinafter, the method of manufacturing a printed circuit board according to this embodiment of the present invention will be described with reference to FIGS. 22 to 25.

Figure 22:
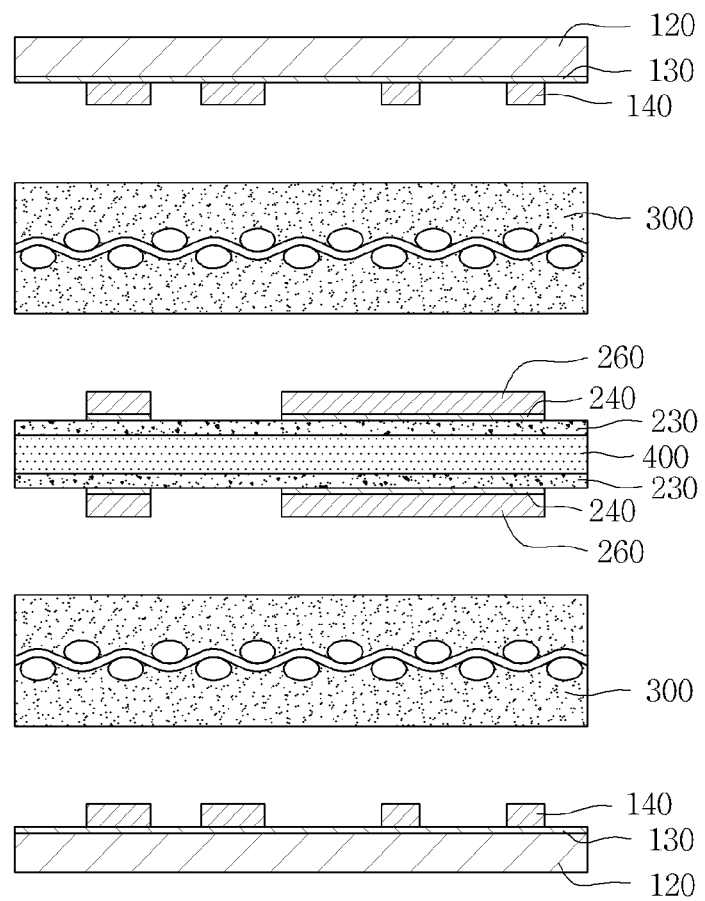
FIGS. 22 to 25 are sectional views showing a method of manufacturing a printed circuit board according to a second embodiment of the present invention.

First, as shown in FIG. 22, carriers, each including a first pattern 140 formed on one side thereof, are formed, and a first solder resist layer 230 and a second pattern 240 and 260 are sequentially formed on both sides of an adhesion layer 400 to prepare an intermediate substrate, and then the carriers are disposed on both sides of the intermediate substrate such that an insulation layer 300 faces the first pattern 140.

In this case, since the carriers, each including a first pattern 140 formed on one side thereof, are formed using the method shown in FIGS. 8 and 9 and have the same structure as those shown in FIGS. 8 and 9, detailed description thereof will be omitted.

Further, the intermediate substrate is formed by sequentially forming the first solder resist layer 230 and a seed layer 240 on the adhesion layer 400, forming a plating layer 260 on the seed layer 240 and then patterning the seed layer 240 and the plating layer 260. Here, an assembly of the seed layer 240 and the plating layer 260 is designated as a second pattern 240 and 260.

Figure 23:
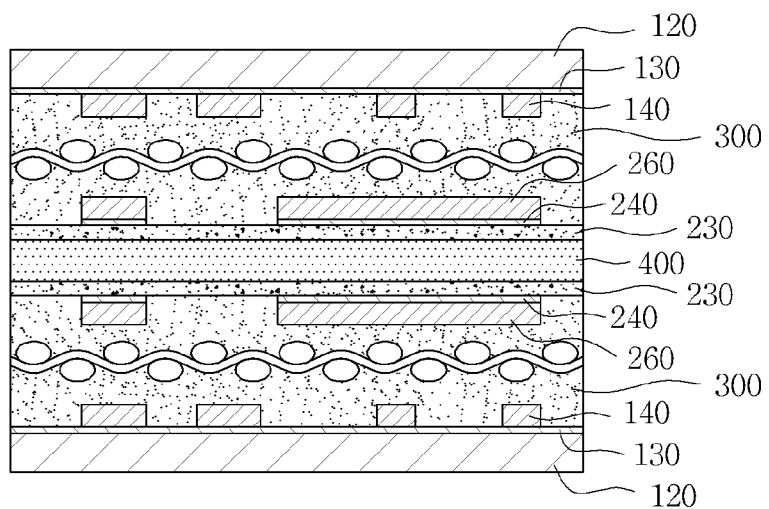

Subsequently, as shown in FIG. 23, the insulation layers 300 and carriers are layered on both sides of the intermediate substrate through a thermal pressing process. A dual-structure substrate is fabricated by performing the thermal pressing process once.

Figure 24:
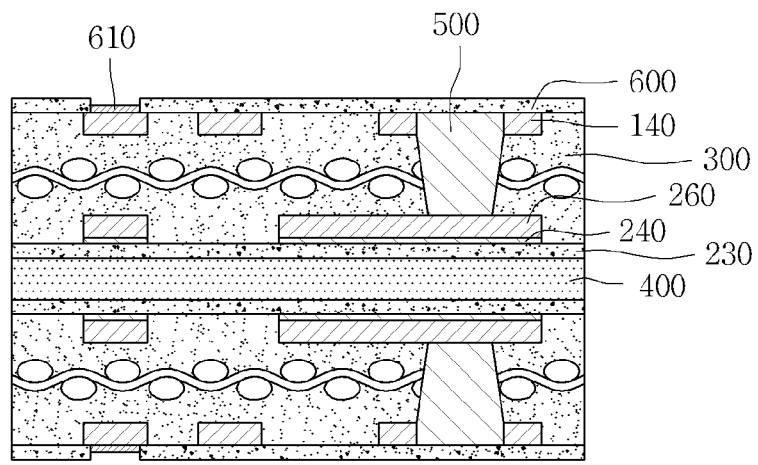

Subsequently, as shown in FIG. 24, a copper foil layer 120, which is a carrier, is removed, a via 500 for connecting the first pattern 140 with the second pattern 240 and 260 is formed in the insulation layer 300, and then a second solder resist layer 600 is to formed on the insulation layer 300 in which the second pattern 240 and 260 is embedded.

Here, a metal barrier 130 is removed while forming the via 500.

In this case, openings for exposing the pad regions of the first pattern 140 are formed in the second solder resist layer 600, and then a protective layer 610 for protecting the exposed first pattern 140 from the external environment is formed.

Figure 25:
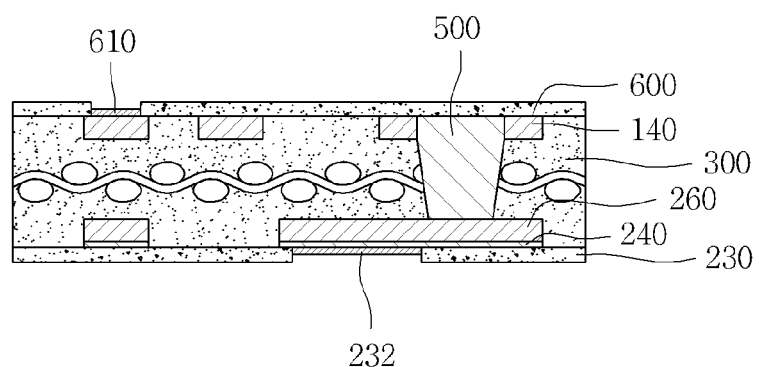

Finally, as shown in FIG. 25, the adhesion layer 400 is removed to manufacture a two-layered printed circuit board. Thereafter, openings for exposing the pad regions of the second pattern 240 and 260 are formed in the first solder resist layer 230, and then a protective layer 232 for protecting the exposed second pattern 240 and 260 from the external environment is formed.

As described above, the printed circuit boards according to the first and second embodiments of the present invention have the structures shown in FIGS. 21 and 25, respectively. That is, each of the printed circuit boards has a structure in which the first pattern 140 composed of a plating layer formed through electrolytic plating is embedded in one side of the insulation layer 300 and the second pattern 240 and 260 composed of the seed layer 240 and the plating layer 260 formed through electrolytic plating is embedded in the other side of the insulation layer 300. In this case, the second solder resist layer 600 is formed on one side of the insulation layer 300, and the first solder resist layer 230 is formed on the other side thereof.

According to the present invention, since additional processes are performed in a state in which two substrates are attached to form a dual structure, the damage of a printed circuit board, occurring during the manufacturing process thereof, can be minimized Specifically, the damage of a thin printed circuit board can be minimized during the via forming process and the second solder resist layer forming process performed after the formation of the dual-structured substrate. Therefore, it is possible to manufacture thin printed circuit boards which are less damaged.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A method of manufacturing a printed circuit board, comprising:
    preparing a pair of a first carrier composed of a metal barrier layer and a first copper foil layer, wherein the metal barrier includes a first pattern formed on one side thereof;
    preparing a pair of a second carrier composed of a second copper foil layer, wherein the second copper foil layer includes a first solder resist layer and a second pattern sequentially formed on one side thereof;
    pressing one of the pair of the first carrier and one of the pair of the second carrier such that the first pattern is embedded in one side of a first insulation layer and the second pattern is embedded in the other side of the first insulation layer and then removing the one of the pair of the first carrier and the one of the pair of the second carrier to fabricate a first base substrate;
    pressing the other one of the pair of the first carrier and the other one of the pair of the second carrier such that the first pattern is embedded in one side of a second insulation layer and the second pattern is embedded in the other side of the second insulation layer and then removing the other one of the pair of the first carrier and the other one of the pair of the second carrier to fabricate a second base substrate;
    attaching the first base substrate and the second base substrate to each other using an adhesion layer such that the first solder resist layers face each other; and
    forming a via for connecting the first pattern with the second pattern in the first and second insulation layers, forming a second solder resist on the first and second insulation layers provided with the first pattern, and then removing the adhesion layer.

2. The method of manufacturing a printed circuit board according to claim 1, wherein the preparing of the first carrier includes:
    sequentially forming the first copper foil layer and the metal barrier layer on both sides of a tape;
    forming the first pattern on the metal barrier layer; and
    removing the tape to prepare the pair of the first carrier including the first copper foil layer and the metal barrier layer whose one side is provided with the first pattern.

3. The method of manufacturing a printed circuit board according to claim 1, wherein the preparing of the second carrier includes:
    sequentially forming the second copper foil layer and the first solder resist layer on both sides of a tape;
    forming a seed layer on the first solder resist layer;
    forming a plating layer on the seed layer and then patterning the seed layer and the plating layer to form the second pattern; and
    removing the tape to prepare the pair of the second carrier including the second copper foil layer whose one side is provided with the first solder resist layer and the second pattern.

4. The method of manufacturing a printed circuit board according to claim 1, wherein, in the forming of the via, before removing the adhesion layer, an opening is formed in the second solder resist layer, and then a protective layer is formed on the first pattern exposed through the opening.

5. The method of manufacturing a printed circuit board according to claim 1, further comprising: after the forming of the via,
    forming an opening in the first solder resist layer; and
    forming a protective layer on the second pattern exposed through the opening.

6. The method of manufacturing a printed circuit board according to claim 1, wherein the adhesion layer is made of a thermal adhesive exhibiting nonadhesiveness during heat treatment.

* * * * *